United States Patent
Yang

(10) Patent No.: US 11,302,735 B2
(45) Date of Patent: Apr. 12, 2022

(54) IMAGE SENSOR INCLUDING TRANSPARENT ELECTRODES

(71) Applicant: SK hynix Inc., Icheon-si (KR)

(72) Inventor: Yun Hui Yang, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 68 days.

(21) Appl. No.: 16/685,959

(22) Filed: Nov. 15, 2019

(65) Prior Publication Data

US 2021/0013249 A1    Jan. 14, 2021

(30) Foreign Application Priority Data

Jul. 12, 2019   (KR) ................ 10-2019-0084539

(51) Int. Cl.
*H01L 27/146*   (2006.01)

(52) U.S. Cl.
CPC .... *H01L 27/1463* (2013.01); *H01L 27/14621* (2013.01); *H01L 27/14627* (2013.01); *H01L 27/14643* (2013.01)

(58) Field of Classification Search
CPC .......... H01L 27/1463; H01L 27/14643; H01L 27/14627; H01L 27/14621; H01L 27/14625; H01L 27/14609; H01L 27/14636; H01L 27/14603; H04N 5/374; H04N 5/378; H04N 5/361
See application file for complete search history.

(56) References Cited

U.S. PATENT DOCUMENTS

| | | | |
|---|---|---|---|
| 2008/0117661 A1* | 5/2008 | Holtzclaw | H01L 27/112 365/96 |
| 2012/0153127 A1* | 6/2012 | Hirigoyen | H01L 27/14609 250/208.1 |
| 2014/0291481 A1 | 10/2014 | Zhang et al. | |
| 2015/0255498 A1* | 9/2015 | Sugiura | H01L 27/1461 257/432 |
| 2019/0148457 A1* | 5/2019 | Lee | H01L 27/1463 257/40 |

FOREIGN PATENT DOCUMENTS

KR   10-2006-0093285    8/2006

* cited by examiner

*Primary Examiner* — Nelson Garces
(74) *Attorney, Agent, or Firm* — Perkins Coie LLP

(57) ABSTRACT

An image sensor includes a substrate configured to include a plurality of pixels, each pixel including a photodiode formed in the substrate, a plurality of deep trench isolation (DTI) structures formed in the substrate to optically isolate each of the plurality of pixels from neighboring pixels, and a transparent electrode layer arranged over the photodiode and electrically connected to the plurality of DTI structures.

14 Claims, 13 Drawing Sheets

IMAGE SENSOR INCLUDING TRANSPARENT ELECTRODES

CROSS-REFERENCE TO RELATED APPLICATION

This patent document claims the priority and benefits of Korean patent application No. 10-2019-0084539, filed on Jul. 12, 2019, the disclosure of which is incorporated by reference herein in its entirety.

TECHNICAL FIELD

Embodiments of the disclosed technology generally relate to an image sensor device.

BACKGROUND

An image sensing device is a device for capturing images by converting light into electrical signals using a photosensitive semiconductor material that reacts to light. In recent times, with the increasing development of technologies in the computer and communication industries, the demand for high-quality, high-performance image sensors is rapidly increasing in various fields of technology such as smartphones, digital cameras, game consoles, Internet of Things (IoT), robots, surveillance cameras, medical micro-cameras, etc.

Image sensors may be broadly classified into a charge coupled device (CCD)-based image sensors and complementary metal oxide semiconductor (CMOS)-based image sensors. The CCD image sensors offer the best available image quality, but they tend to consume more power and are larger as compared to CMOS image sensors. The CMOS image sensors are smaller in size and consume less power than the CCD image sensors. The CMOS image sensors may be implemented using many different scanning schemes, and because CMOS sensors are fabricated using the CMOS fabrication technology, the CMOS image sensors and other signal processing circuitry can be integrated into a single chip, resulting in reduction in production costs. In recent times, the CMOS image sensors are being intensively researched and rapidly coming into widespread use.

SUMMARY

This patent document provides, among others, designs of an image sensor that can avoid dark current noise.

In an embodiment of the disclosed technology, an image sensor may include a substrate configured to include a plurality of pixels, each pixel including a photodiode that detects light, a plurality of deep trench isolation (DTI) structures formed in the substrate to optically isolate each of the plurality of pixels from neighboring pixels, and a transparent electrode layer arranged over the photodiode and electrically connected to the plurality of DTI structures.

In another embodiment of the disclosed technology, an image sensor may include an active pixel including at least one photodiode and configured to have a deep trench isolation (DTI) structure and a first transparent electrode layer, the DTI and the first transparent electrode layer being coupled to each other and configured to receive a first bias for accumulating electrical charges along the DTI structure, and an optical black pixel including at least one photodiode and configured to have the DTI structure and a second transparent electrode layer, the DTI and the second transparent electrode layer being coupled to each other and configured to receive a second bias for accumulating electrical charges along the DTI structure. The first bias is adjustable independently from the second bias.

In another embodiment of the disclosed technology, an image sensor may include an active pixel configured to generate a pixel signal corresponding to incident light, an optical black pixel configured to generate another pixel signal that is not due to the incident light, a first bias generator configured to generate a first bias for accumulating electrical charges along the DTI structure to apply the first bias to a deep trench isolation (DTI) structure and a first transparent electrode layer arranged in the active pixel, and a second bias generator configured to generate a second bias for accumulating electrical charges along the DTI structure to apply the second bias to a DTI structure and a second transparent electrode layer arranged in the optical black pixel. The first bias is adjustable independently from the second bias.

In another embodiment of the disclosed technology, an image sensor may include a substrate configured to include a photodiode, a deep trench isolation (DTI) structure configured to optically isolate a pixel located adjacent to a pixel provided with the photodiode from the photodiode, and a transparent electrode layer located adjacent to the substrate at an upper part of the photodiode.

In another embodiment of the disclosed technology, an image sensor may include an active pixel configured to have a deep trench isolation (DTI) structure and a transparent electrode layer that receive a first bias, and an optical black pixel configured to have a DTI structure and a transparent electrode layer that receive a second bias.

In another embodiment of the disclosed technology, an image sensor may include an active pixel configured to generate a pixel signal corresponding to the amount of incident light, an optical black pixel configured to generate a pixel signal irrespective of the incident light, a first bias generator configured to generate a first bias applied to a deep trench isolation (DTI) structure and a transparent electrode layer that are contained in the active pixel, and a second bias generator configured to generate a second bias applied to a DTI structure and a transparent electrode layer that are contained in the optical black pixel.

It is to be understood that the foregoing general description, the accompanying drawings, and the following detailed description in this patent document are illustrative and explanatory of technical features and implementations of the disclosed technology.

DETAILED DESCRIPTION

Figure 1:
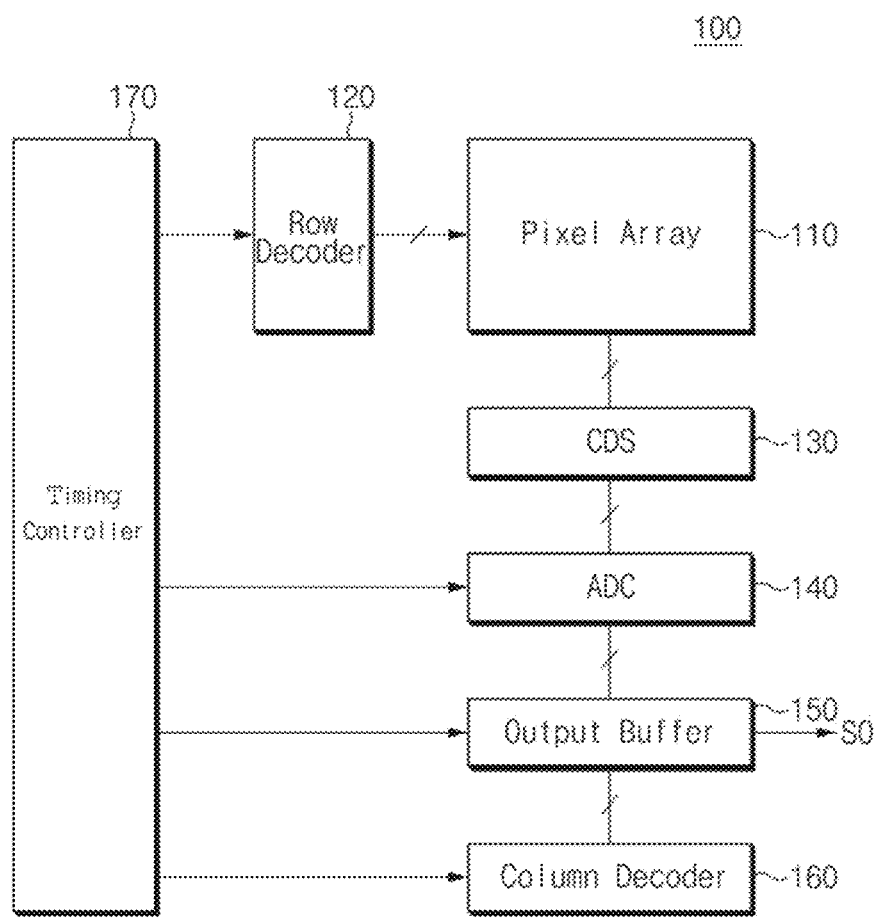
FIG. 1 is a block diagram illustrating an example of an image sensor based on an embodiment of the disclosed technology.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings. However, the disclosure should not be construed as being limited to the embodiments set forth herein, but on the contrary, the disclosure is intended to cover all modifications, equivalents, and alternatives falling within the spirit and scope of the embodiments. In the drawings, the sizes and shapes of elements may be exaggerated for convenience and clarity of description.

FIG. 1 is a block diagram illustrating an example of an image sensor 100 based on an embodiment of the disclosed technology.

Referring to FIG. 1, the image sensor 100 may include a pixel array 110, a row decoder 120, a correlated double sampling (CDS) circuit 130, an analog-to-digital converter (ADC) 140, an output buffer 150, a column decoder 160, and a timing controller 170. In this case, the above-mentioned constituent elements of the image sensor 100 are merely examples, and at least some constituent elements from among the constituent elements may be added to or omitted from the image sensor 100 as necessary.

The pixel array 110 may include a plurality of pixels arranged in a two-dimensional (2D) matrix composed of a plurality of rows and a plurality of columns. Each pixel may convert an optical image (e.g., light incident onto the plurality of pixels) into an electrical signal to represent the optical image. In converting the optical image to the electrical image, the pixel array 110 may operate based on a pixel control signal from the row decoder 120.

The row decoder 120 may select one or more pixels of the pixel array 110 responsive to control signals of the timing controller 170. In one example, the row decoder 120 may generate a row selection signal to select at least one row from among the plurality of rows based on the control signals from the timing controller 170. In this way, the row decoder 120 may select pixels included in the selected row. In some implementations, the row decoder 120 may sequentially enable a pixel reset signal for the selected pixels, and may enable a transmission (Tx) signal for the selected pixels. As a result, an analog-type reference signal and an image signal that are generated from each pixel of the selected row may be sequentially transmitted to the CDS circuit 130. In the context of this patent document, a word "pixel signal" may be used to indicate both the reference signal and the image signal.

Image sensing devices may use the correlated double sampler (CDS) to remove an offset value of pixels by sampling a pixel signal twice so that the difference is taken between these two samples. For example, the correlated double sampler (CDS) may remove an offset value of pixels by comparing pixel output voltages obtained before and after light is incident on the pixels, so that only pixel signals based on the incident light can be actually measured. In some implementations, the CDS circuit 130 may sequentially sample and hold the reference signal and the image signal transferred from the pixel array 110 to each of the plurality of column lines. That is, the CDS circuit 130 may sample and hold voltage levels of the reference signal and the image signal corresponding to each column of the pixel array 110.

The CDS circuit 130 may transmit a correlated double sampling (CDS) signal corresponding to the reference signal and the image signal for each column to the ADC 140 upon receiving a control signal from the timing controller 170.

In some implementations, the ADC 140 may use a reference signal (e.g., ramp signal) to sample an input signal (e.g., pixel signal) multiple times using the reference signal and analog-to-digital convert the sampled input signals by counting the number of clocks until crossing points. For example, the ADC 140 may count clock pulses during a period of time when the input signal is above the reference signal and stop counting clock pulses upon detection of a crossing point (crossing of the reference signal and the input signal).

Upon receiving the CDS signal for each column from the CDS circuit 130, the ADC 140 may convert the received analogue CDS signal into a digital signal and output the digital signal. The ADC 140 may perform counting and calculation operations based on the CDS signal for each column and a ramp signal received from the timing controller 170, such that the ADC 140 may generate digital image data that does not include any noisy data from each column (e.g., unique reset noise for each pixel).

In an embodiment of the disclosed technology, the ADC 140 may include a plurality of column counters corresponding to respective columns of the pixel array 110 to convert the CDS signal for each column into a digital signal using the column counters. In another embodiment of the disclosed technology, the ADC 140 may include a single global counter to convert a CDS signal corresponding to each column into a digital signal using a global code received from the global counter.

The CDS circuit 130 and the ADC 140 may include any circuitry that is capable of processing pixel signals.

The output buffer 150 may receive image data for each column from the ADC 140, and may output the captured image data. Upon receiving a control signal from the timing controller 170, the output buffer 150 may temporarily store image data that is output from the ADC 140. The output buffer 150 may operate as an interface between the image sensor 100 and another device coupled to the image sensor 100 to compensate for a difference in operating characteristics such as transmission (Tx) speed and processing speed.

The column decoder 160 may select one or more columns between the columns of the output buffer 150 upon receiving a control signal from the timing controller 170. The column decoder 160 may sequentially output the temporarily stored image data to the selected one or more columns of the output buffer 150. In some implementations, the column decoder 160 may receive an address signal from the timing controller 170 to generate a column selection signal based on the received address signal. The column decoder 160 may select a column of the output buffer 150, such that image data is output as an output signal S0 from the selected column of the output buffer 150.

The timing controller 170 may generate controlling signals for the row decoder 120, the ADC 140, the output buffer 150, and the column decoder 160.

In some implementations, the timing controller 170 may generate clock signals for internal circuitry of the image sensor 100. For example, the timing controller 170 may provide the row decoder 120, the column decoder 160, the ADC 140, and the output buffer 150 with timing control signals and address signals by which one or more rows and/or columns are selected at a certain timing. In some embodiments, the timing controller 170 may include a logic control circuit, a phase locked loop (PLL) circuit, a timing control circuit, a communication interface circuit, and others.

Figure 2:
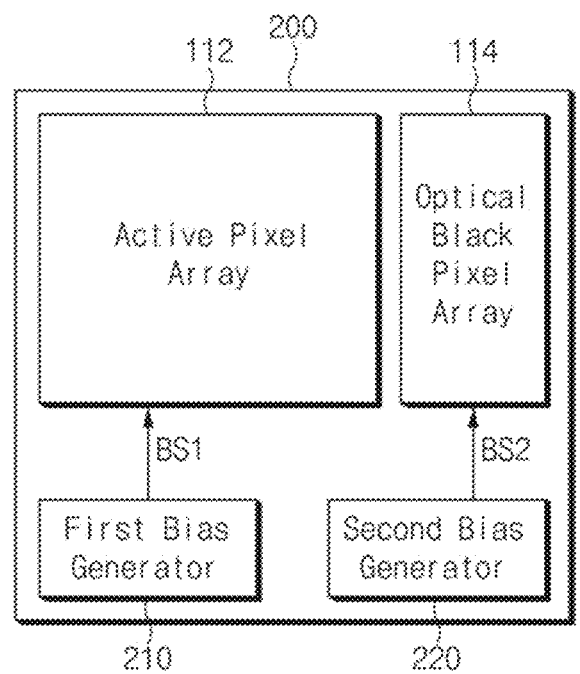
FIG. 2 is a block diagram illustrating an example configuration of the image sensor shown in FIG. 1 based on an embodiment of the disclosed technology.

FIG. 2 is a block diagram illustrating an example configuration of the image sensor shown in FIG. 1 based on an embodiment of the disclosed technology.

FIG. 2 briefly illustrates, among others, some internal circuits that are relevant to improving dark characteristics (dark current characteristics).

The image sensor 200 may include an active pixel array 112, an optical black pixel array 114, a first bias generator 210, and a second bias generator 220.

The active pixel array 112 and the optical black pixel 114 may (at least in part) constitute the pixel array 110 shown in FIG. 1.

The active pixel array 112 may include a plurality of active pixels arranged in a matrix shape composed of a plurality of rows and a plurality of columns. Each active pixel may be configured to convert incident light into an electrical signal as depicted in FIG. 1.

The optical black pixel array 114 may include at least one optical black pixel, each corresponding to each row of the active pixel array 112. Each of the optical black pixels may be used to generate a dark level signal that is not due to incident light. While each optical black pixel is almost identical in structure to each active pixel belonging to the same row and operates by the same pixel control signal as the active pixel belonging to the same row, the optical black pixel may have a light shielding structure that the active pixel does not have. As such, the optical black pixel may generate a signal that indicates dark noise the active pixel generates due to factors (e.g., temperature, unique noise for each pixel structure, etc.) other than incident light.

Image data (image data free from dark noise) of an active pixel belonging to a certain row may be obtained by subtracting an average value of dark level signals of at least one optical black pixel corresponding to the certain row from the value generated by the active pixel based on incident light. By way of example and not by limitation, such a subtraction process can be performed by an image signal processor (not shown).

The first bias generator 210 may apply a first bias BS1 to the active pixel array 112 to suppress a dark current generated from each active pixel. The principles for suppressing generation of such dark current based on the first bias BS1 will be described later with reference to FIG. 5.

The second bias generator 220 may apply a second bias BS2 to the optical black pixel array 114 to suppress a dark current generated from each optical black pixel. The principles for suppressing generation of such dark current based on the second bias BS2 will be described later with reference to FIG. 6.

Appropriate voltage values of the first bias BS1 and the second bias BS2 may be decided in a wafer probe test process. Such first-bias (BS1) voltage value and the decided second-bias (BS2) voltage value may be stored in a one-time programmable (OTP) memory to be used during operation of the image sensor 100. The first bias generator 210 may generate a voltage corresponding to the first-bias (BS1) voltage value, and the second bias generator 220 may generate a voltage corresponding to the second-bias (BS2) voltage value. In an embodiment of the disclosed technology, the image sensor 100 may include the OTP memory. In one example, each of the first bias generator 210 and the second bias generator 220 may include the OTP memory.

In one example, the first bias BS1 may be identical to the second bias BS2. In another example, the first bias BS1 differs from the second bias BS2. The voltage value of each of the first bias BS1 and the second bias BS2 may be such that the dark current is suppressed in each pixel. The voltage value of each of the first bias BS1 and the second bias BS2 may also accurately reflect the dark noise. A method for deciding the first bias BS1 and the second bias BS2 will be described later with reference to FIGS. 7 and 8.

By way of example and not by limitation, each of the first bias BS1 and the second bias BS2 may be a negative (−) voltage.

In an embodiment of the disclosed technology, the first bias BS1 may be applied to all the active pixels arranged in the active pixel array 112, and the second bias BS2 may be applied to all the optical black pixels arranged in the optical black pixel array 114. In another embodiment of the disclosed technology where the active pixel array 112 is divided into two or more active pixel groups, two or more voltage values are used as the first bias BS1 such that the two or more voltage values are applied to the two or more active pixel groups, respectively. In addition, where the optical black pixel array 114 is divided into two or more optical black pixel groups, two or more voltage values may be used as the second bias BS2 such that the two or more voltage values are applied to the two or more optical black pixel groups, respectively. In this way, the image sensor implemented based on the embodiments of the disclosed technology may reduce a dark current in the active pixel array 112 and the optical black pixel array 114, minimizing dark noise that can occur from the active pixel array 112 and the optical black pixel array 114.

In one example, the first bias generator 210 and the second bias generator 220 may be located in the row decoder 120 shown in FIG. 1. In another example, the first bias generator 210 and the second bias generator 220 may be located outside the row decoder 120.

Figure 3:
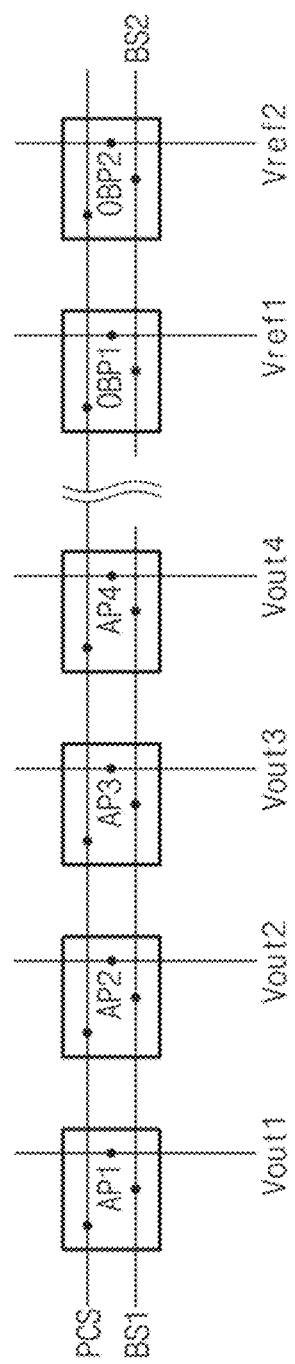
FIG. 3 illustrates examples of input/output (I/O) signals of an active pixel array and an optical black pixel array shown in FIG. 2 based on an embodiment of the disclosed technology.

FIG. 3 illustrates examples of input/output (I/O) signals of the active pixel array and the optical black pixel array shown in FIG. 2 based on an embodiment of the disclosed technology.

Input/output (I/O) signals of the active pixels AP1-AP4 arranged in the same row of the active pixel array, and I/O signals of the optical black pixels OBP1-OBP2 arranged in the same row of the optical black pixel array 114 are shown in FIG. 3. Although only four active pixels and two optical black pixels are shown in FIG. 3 for convenience of description, it should be noted that each row may include any number of active pixels and any number of optical black pixels.

In some implementations, the active pixels AP1-AP4 and the optical black pixels OBP1-OBP2 may receive the same pixel control signal PCS. The pixel control signal PCS may be used to operate the active pixels and the optical black pixels, and may include a transmission control signal, a reset control signal, a selection control signal, and others. In addition, each of the active pixels AP1-AP4 may receive the first bias BS1, and each of the optical black pixels OBP1-OBP2 may receive the second bias BS2.

The active pixels AP1, AP2, AP3, and AP4 may output pixel signals Vout1, Vout2, Vout3, and Vout4, respectively. The optical black pixels OBP1 may output a pixel signal Vref1, and the optical black pixel OBP2 may output a pixel signal Vref2.

Figure 4:
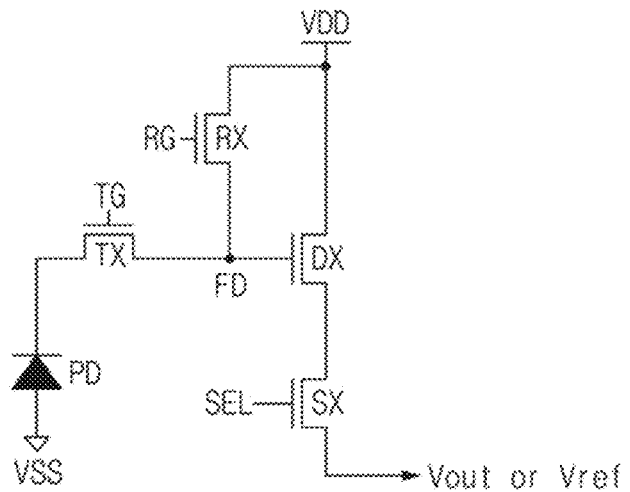
FIG. 4 is a circuit diagram illustrating an example of an active pixel or an optical block pixel shown in FIG. 3 based on an embodiment of the disclosed technology.

FIG. 4 is a circuit diagram illustrating an example of the active pixel or the optical block pixel shown in FIG. 3 based on an embodiment of the disclosed technology.

By way of example and not by limitation, each of the active pixel and the optical black pixel may include a photodiode PD, a transfer transistor TX, a reset transistor RX, a drive transistor DX, and a selection transistor SX. Although only a 4TR (i.e., four-transistor) structure is depicted in FIG. 4 for convenience of description, it should be noted that the active pixel or the optical black pixel may include a 3TR (i.e., three-transistor) structure, a 5TR (i.e., five-transistor) structure, or a shared pixel structure in which multiple pixels share at least some transistors.

The photodiode PD may accumulate photocharges generated based on the light incident on the photodiode PD. The photodiode PD may be coupled between a source voltage VSS and one or more transfer transistors TX. By way of example and not by limitation, the source voltage VSS may be a ground voltage. The photodiode PD may be an example of a photoelectric conversion element. In another example, the photodiode PD may also be implemented as a phototransistor, a photogate, a pinned photodiode or a combination thereof.

The transfer transistor TX may be coupled between the photodiode PD and the floating diffusion (FD) region. The transfer transistor TX may be turned on or off in response to a transmission control signal TG, so that the transfer transistor TX may pass photocharges accumulated in the photodiode PD to the floating diffusion (FD) region.

The floating diffusion (FD) region may receive photocharges of the photodiode PD through the transfer transistor TX, such that the received photocharges can be accumulated (or stored) in the floating diffusion (FD) region. In this case, the floating diffusion (FD) region may be modeled as a single junction capacitor.

The reset transistor TX may be coupled between a drain voltage (VDD) terminal and the floating diffusion (FD) region, and may reset a voltage level of the floating diffusion (FD) region to the drain voltage VDD in response to a reset control signal RG. By way of example and not by limitation, the drain voltage VDD may be a power-supply voltage.

The drive transistor DX may generate an output voltage that follows a change in electric charges at the floating diffusion (FD) region, which are based on the photocharges accumulated in the photodiodes PD. In other words, the drive transistor DX may operate as a source follower transistor. The output voltage of the drive transistor DX is then applied to the selection transistor SX.

The selection transistor SX may select at least one pixel to perform a readout. In one example, the readout is performed on a row basis. The selection transistor SX may be turned on by a selection control signal SEL, and may generate an output voltage Vout or Vref corresponding to the output voltage of the drive transistor DX, which is based on the electric charges at of the floating diffusion (FD) region. As discussed above, the voltage at a drain (i.e., a source of the source follower transistor) of the selection transistor SX follows the voltage at the floating diffusion (FD) region.

The output voltage Vout or Vref of the selection transistor SX may correspond to a reference signal (i.e., a signal corresponding to the voltage at the floating diffusion region after the reset) depicted in FIG. 1 and an image signal (i.e., a signal corresponding to the voltage at the floating diffusion region in which photocharges received from the photodiode PD are accumulated).

Figure 5:
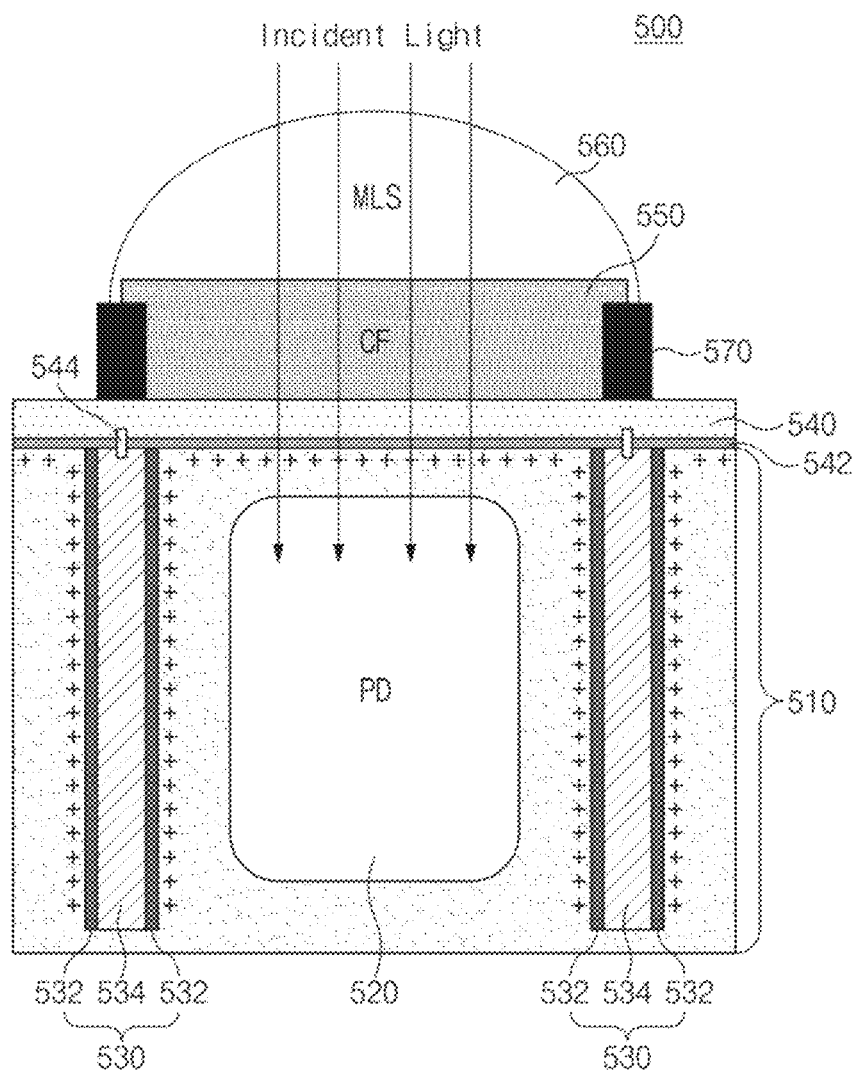
FIG. 5 is a cross-sectional view illustrating an example of the active pixel based on an embodiment of the disclosed technology.

FIG. 5 is a cross-sectional view illustrating an example of the active pixel 500 based on an embodiment of the disclosed technology.

Here, the active pixel 500 can include the photodiode PD of the active pixel in the active pixel array depicted in FIG. 2.

The active pixel 500 may include a substrate 510, a photodiode 520, a deep trench isolation (DTI) structure 530, a transparent electrode layer 540, an insulation layer 542, a color filter 550, a microlens 560, and a grid 570.

The substrate 510 may be a silicon (Si) substrate that includes a photodiode PD and a DTI structure 530. The substrate 510 may be a P-type substrate doped with P-type ions. In FIG. 5, a bottom surface of the substrate 510 may be defined as a "front side" indicating a front surface, and a top surface of the substrate 510 may be defined as a "back side" indicating a back surface. Therefore, the active pixel 500 shown in FIG. 5 may be formed to have a back side illumination (BSI) structure that receives incident light through the back side of the substrate 510.

The photodiode 520 may include an N-type doped region that is doped with N-type ions through ion implantation. In one embodiment, the photodiode 520 may be formed by stacking a plurality of doped regions. In one example, a lower doped region may be formed by implantation of $N^+$ ions, and an upper doped region may be formed by implantation of $N^-$ ions. The photodiode 520 may be arranged across as large a region as possible to increase a fill factor indicating light reception (Rx) efficiency.

The DTI structure 530 may be formed to surround at least part of the active pixel 500 when viewed in a plane. In addition, the DTI structure 530 may include a trench that is formed by etching deep into the substrate in a vertical direction, so that the DTI structure 530 can electrically and/or optically isolate each active pixel from adjacent pixels. In some implementations, the DTI structure 530 may be formed through a DTI fabrication process associated with the back side of the substrate 510, and the DTI structure 530 may be called backside DTI (BDTI).

The DTI structure 530 may include a sidewall 532 and an electrode 534.

The sidewall 532 may be formed of an insulation material that is different in refractive index from the substrate 510. In some implementations, the sidewall 532 may be formed of a highly reflective insulation material such as a silicon oxide film, a silicon nitride film, and silicon oxynitride film. The sidewall 532 may be used to avoid a potential optical crosstalk that may occur when light incident into the active pixel 500 propagates to neighboring pixels. In this way, it is possible to reduce signal-to-noise ratio (SNR).

The electrode 534 may be formed of a conductive material that fills a trench region of the DTI structure 530 in an inner region of the sidewall 532. By way of example and not by limitation, the electrode 534 may be formed of polysilicon or polysilicon doped with impurities. The electrode 534 may receive a first bias BS1. In some embodiments of the disclosed technology, the first bias BS1 is a negative (−) voltage, and in this case, electrons in the electrode 534 may move to a position closer to the sidewall 532. As a result, electron holes in the substrate 510 may flow into an interface of the sidewall 532, so that the electron holes can be accumulated and fixed. Those electron holes accumulated and fixed at the interface of the sidewall 532 can resist flow of electrons generated from the surface of the substrate 510 that can result in a dark current.

When viewed in a plane, the transparent electrode layer 540 may be formed to cover at least part of the active pixel 500. When viewed in a cross-section of the transparent electrode layer 540, the transparent electrode layer 540 may be located adjacent to the substrate 510 at an upper part of the photodiode 520. The transparent electrode layer 540 may be formed of a conductive material (e.g., Indium Tin Oxide) having high light transmittance and conductivity. Thickness of the transparent electrode layer 540 may be decided based on its conductivity and light transmittance.

In addition, the insulation layer 542 may be disposed between the substrate 510 and the transparent electrode layer 540. The insulation layer 542 may be arranged along the transparent electrode layer 540 to isolate the transparent electrode layer 540 from the substrate 510. By way of example and not by limitation, the insulation layer 542 is formed of an oxide material having high light transmittance.

The transparent electrode layer 540 may receive the negative (−) voltage as the first bias BS1. As the negative first bias BS1 is applied to the transparent electrode layer 540, electrons in the transparent electrode layer 540 move to a position closer to the substrate 510. As a result, electron holes in the substrate 510 may flow into an interface of the transparent electrode layer 540, so that the electron holes can be accumulated and fixed. The electron holes accumulated and fixed at the interface of the transparent electrode layer 540 can resist flow of electrons generated from the surface of the substrate 510 that can result in a dark current.

On the other hand, the transparent electrode layer 540 may be formed to directly contact the electrode 534, or may be electrically coupled to the electrode 534 through a contact 544 formed to pass through the insulation layer 542. The contact 544 may be formed of a high-conductivity material (e.g., metal). The first bias generator 210 may transmit the first bias BS1 to the electrode 534 and/or to the transparent electrode layer 540 through an electrical line (not shown) and a voltage-supply structure.

In another embodiment, the DTI structure 530 may be a frontside DTI (FDTI) structure that is formed through the DTI fabrication process associated with the front side of the substrate 510, instead of the back side of the substrate 510. In this case, the electrode 534 and the transparent electrode layer 540 may be electrically isolated from each other. The first bias generator 210 may apply the first bias BS1 to the electrode through the electrical line (not shown), and may independently apply the first bias BS1 to the transparent electrode layer through the electrical line (not shown) and the voltage-supply structure. In contrast, even when the DTI structure 530 is used as the FDTI structure, the first bias BS1 may also be coupled to the transparent electrode layer 540 through the contact 544.

The color filter 550 may be formed over the transparent electrode layer 540, and may filter light by wavelength range (e.g., red light, green light, blue light, magenta light, yellow light, cyan light). In an embodiment of the disclosed technology, a reflection prevention layer (not shown) may be formed below the color filter 550. In an embodiment of the disclosed technology, when the active pixel 500 corresponds to a depth pixel, the color filter 550 may be omitted or may be replaced with an infrared (IR) filter.

The microlens 560 may be formed over the color filter 560, and may increase light gathering power of incident light, resulting in increased light reception (Rx) efficiency.

The grid 570 may be formed to reduce optical crosstalk between neighboring color filters 550. By way of example and not by limitation, the grid 570 is formed of a metallic material (e.g., tungsten) having high absorptivity (i.e., a high absorption rate).

Although FIG. 5 illustrates only one pixel that includes the color filter 550, the microlens 560, and the grid 560 for convenience of description, it should be noted that a plurality of pixels each including the color filter 550, the microlens 560, and the grid 570 can be arranged in rows and columns to form a pixel array.

Figure 6:
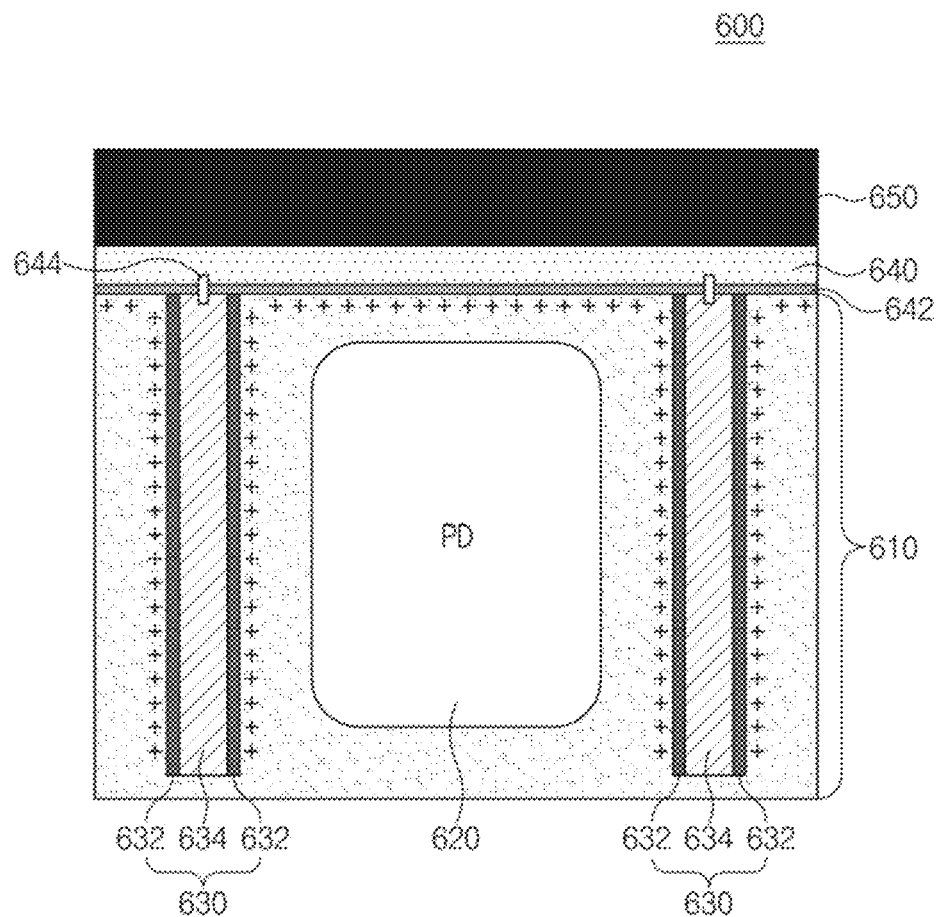
FIG. 6 is a cross-sectional view illustrating an example of the optical black pixel based on an embodiment of the disclosed technology.

FIG. 6 is a cross-sectional view illustrating an example of the optical black pixel 600 based on an embodiment of the disclosed technology.

Here, the optical black pixel 600 can include the photodiode PD of the optical black pixel in the optical black pixel array 114 shown in FIG. 2.

The optical black pixel 600 may include a substrate 610, a photodiode 620, a DTI structure 630, a transparent electrode layer 640, an insulation layer 642, and a light shielding layer 650. In this case, the substrate 610, the photodiode 620, the DTI structure 630, the transparent electrode layer 640, and the insulation layer 642 depicted in FIG. 6 are similar or identical to the substrate 510, the photodiode 520, the DTI structure 530, the transparent electrode layer 540, and the insulation layer 542 depicted in FIG. 5, respectively. In some implementations, the DTI structure 630 and the transparent electrode layer 640 depicted in FIG. 6 receive the second bias BS2 in a different way from FIG. 5, but the remaining characteristics of the DTI structure 630 and the transparent electrode layer 640 are similar or identical in structure and function to those of the DTI structure 530 and the transparent electrode layer 540.

On the other hand, unlike the active pixel 500, the optical black pixel 600 may include the light shielding layer 650 formed to prevent incident light from being transferred to an upper part of the transparent electrode layer 640.

In some implementations, the light shielding layer 650 may be arranged to cover all the optical black pixels 600 corresponding to the transparent electrode layer 640, preventing incident light from passing through a lower part thereof. By way of example and not by limitation, the light shielding layer 650 may be formed of a metal material (e.g., tungsten) having high absorptivity (i.e., a high absorption rate), and it should be noted that a high-reflectivity material can also be deposited over the light shielding layer 650 as needed.

Figure 7:
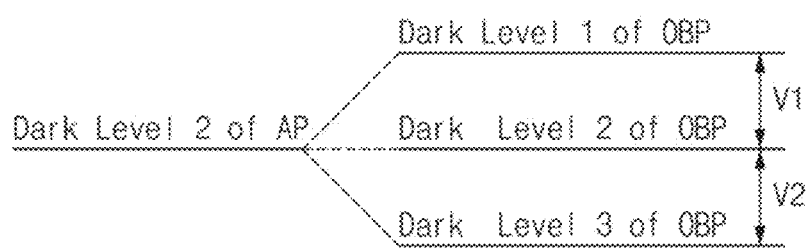
FIG. 7 is a conceptual diagram illustrating a dark offset between the active pixel and the optical black pixel based on an embodiment of the disclosed technology.

FIG. 7 is a conceptual diagram illustrating a dark offset between the active pixel and the optical black pixel based on an embodiment of the disclosed technology.

The active pixel 500 may generate a pixel signal corresponding to the amount of photons in the incident light, and the optical black pixel 600 may generate a pixel signal in a situation in which incident light is blocked or shielded. Therefore, in an ideal situation, the signal generated from each active pixel 500 in a dark environment and the signal generated from each optical black pixel 600 should be identical to each other.

In reality, however, due to the structural difference between the active pixel 500 and the optical black pixel 600 (e.g., the upper structure of the transparent electrode layer), and/or due to a difference in the fabrication process to form the above-mentioned structural difference between the active pixel 500 and the optical black pixel 600, a signal generated by each active pixel 500 and a signal generated by each optical black pixel 600 may be different from each other in the dark environment.

Each of the signal generated by each active pixel 500 and the signal generated by each optical black pixel 600 in the dark environment will hereinafter be referred to as a dark-level signal.

In the ideal environment, the dark-level signal of the optical black pixel 600 should be identical to a second dark level signal (Dark level 2) corresponding to the dark level signal of the active pixel 500.

However, since there is a structural difference between the active pixel 500 and the optical black pixel 600 as described above, the dark-level signal of the optical black pixel 600 may be a first dark-level signal (Dark Level 1), which is higher than the second dark-level signal (Dark Level 2) by a first voltage level (V1), or may be a third dark-level signal (Dark Level 3), which is lower than the second dark-level signal (Dark Level 2) by a second voltage level (V2). In this case, the first voltage level V1 or the second voltage level V2 may be defined as a dark offset.

If the dark-level signal of the optical black pixel 600 is the first dark level signal (Dark Level 1), at least part of the actual signal converted from the incident light may be lost in the process of subtracting the dark-level signal of the optical black pixel 600 from the signal generated by the active pixel 500.

If the dark-level signal of the optical black pixel 600 is the third dark-level signal (Dark Level 3), at least part of dark-noise components may still remain even after subtracting the dark-level signal of the optical black pixel 600 from the signal generated by the active pixel 500. This can impede the ability to express black color.

The embodiments of the disclosed technology can be used to adjust the dark-level signal of the optical black pixel 600 to be identical to the dark-level signal of the active pixel 500.

Figure 8:
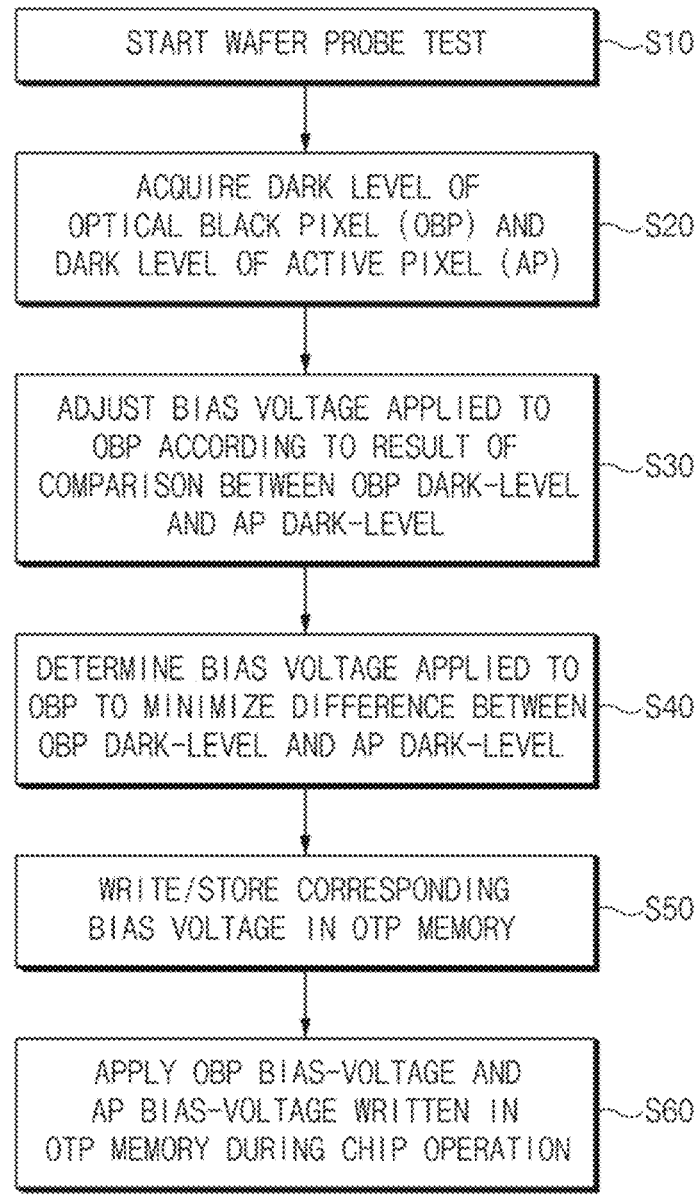
FIG. 8 is a flowchart illustrating a method for adjusting a dark level of the active pixel to be identical to a dark level of the optical black pixel based on an embodiment of the disclosed technology.

FIG. 8 is a flowchart illustrating a method for adjusting a dark level of the active pixel to be identical to a dark level of the optical black pixel based on an embodiment of the disclosed technology.

As shown in FIG. 8, the method includes, after beginning the wafer probe test process (S10), acquiring a dark-level signal from each of the active pixel 500 and the optical black pixel 600 in the dark environment (S20).

The method may also include adjusting the second bias BS2 applied to the optical black pixel 600 based on the comparison between the dark-level signal acquired from each active pixel 500 and the other dark-level signal acquired from each optical black pixel 600 (S30). In another embodiment, the method may include adjusting the first bias BS1 applied to the active pixel 500 based on the comparison the dark-level signals. In another embodiment, the first bias BS1 and the second bias BS2 may be simultaneously or alternately adjusted based on the comparison the dark-level signals.

The process of adjusting the second bias BS2 applied to the optical black pixel 600 may be continuously performed until a difference between the dark-level signal acquired from each active pixel 500 and the dark-level signal acquired from each optical black pixel 600 can be minimized. In this way, the second bias BS2 for minimizing the difference between the dark-level signals can be finally decided (S40).

The first-bias (BS1) voltage value and the second bias (BS2) voltage value decided in step S40 may be stored in the OTP memory (S50).

Steps S10 to S40 may be completed in the wafer probe test process. During the operation of the tested image sensor chip, the first bias generator 210 may output a bias voltage to the active pixel array 112 based on the first-bias (BS1) voltage value stored in the OTP memory, and the second bias generator 220 may output a bias voltage to the optical black pixel array 114 based on the second-bias (B S2) voltage value stored in the OTP memory (S60).

Figure 9:
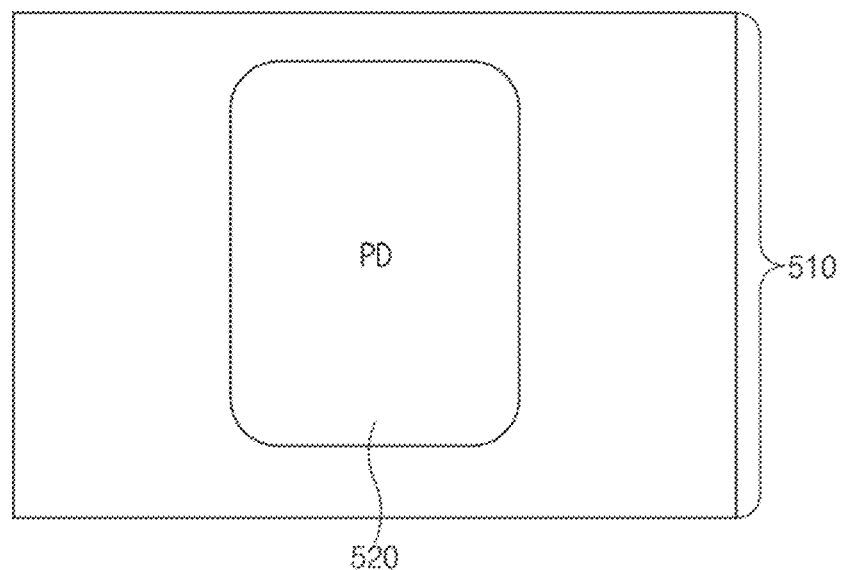
FIG. 9 is a diagram illustrating the active pixel at a fabrication step in one method based on some embodiments of the disclosed technology.

FIG. 9 is a diagram illustrating the active pixel at a fabrication step in one method based on some embodiments of the disclosed technology.

In a first process 900, after a patterned mask (not shown) is disposed over the substrate 510, and the photodiode 520 is formed through ion implantation.

Figure 10:
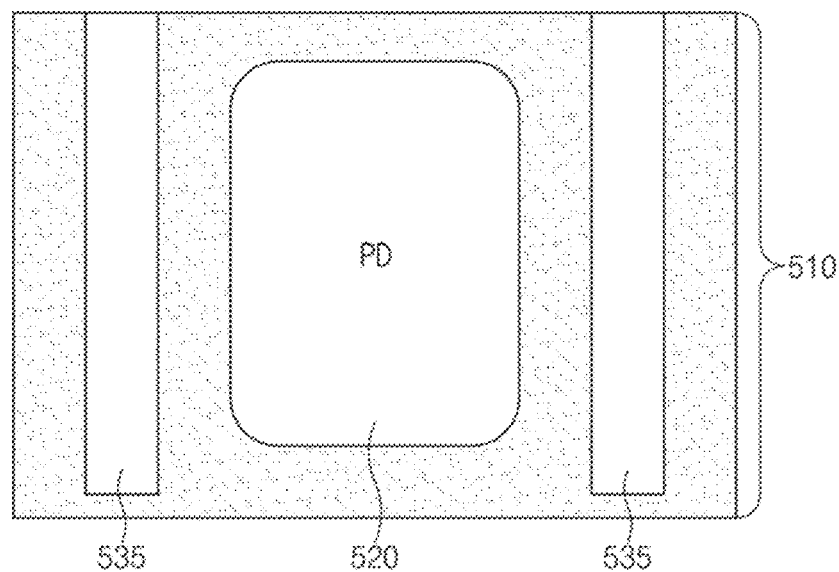
FIG. 10 is a diagram illustrating the active pixel at another fabrication step in one method based on some embodiments of the disclosed technology.

FIG. 10 is a diagram illustrating the active pixel at another fabrication step in one method based on some embodiments of the disclosed technology.

In a second process 1000, after formation of the photodiode 520, the patterned mask (not shown) may be removed, and the patterned hard mask (not shown) may be formed over the substrate 510. The substrate 510 may be etched using the patterned hard mask (not shown) as an etch barrier, resulting in formation of a deep trench 535. The depth of the deep trench 535 may be determined to be a depth where optical crosstalk and electrical crosstalk between the contiguous active pixels can be optimized.

The DTI fabrication process for forming the deep trench 535 may include a Bosch process. That is, the inductive coupled plasma deep reactive ion etching (ICP DRIE) process based on $SF_6$ or $O_2$ plasma and the sidewall passivation process based on any one of CFx-based materials such as $C_4F_8$ may be repeatedly performed for a predetermined number of iterations, resulting in formation of the deep trench 535.

Figure 11:
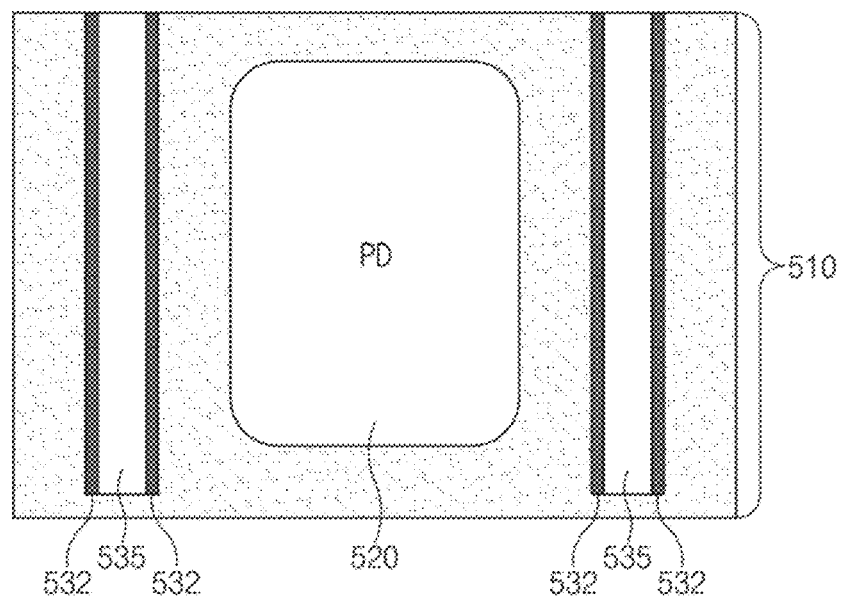
FIG. 11 is a diagram illustrating the active pixel at another fabrication step in one method based on some embodiments of the disclosed technology.

FIG. 11 is a diagram illustrating the active pixel at another fabrication step in one method based on some embodiments of the disclosed technology.

In a third process 1100, after formation of the deep trench 535, the patterned hard mask (not shown) may be removed, and a film formed of an insulation layer may be formed in the deep trench 535, resulting in formation of the sidewall 532.

Figure 12:
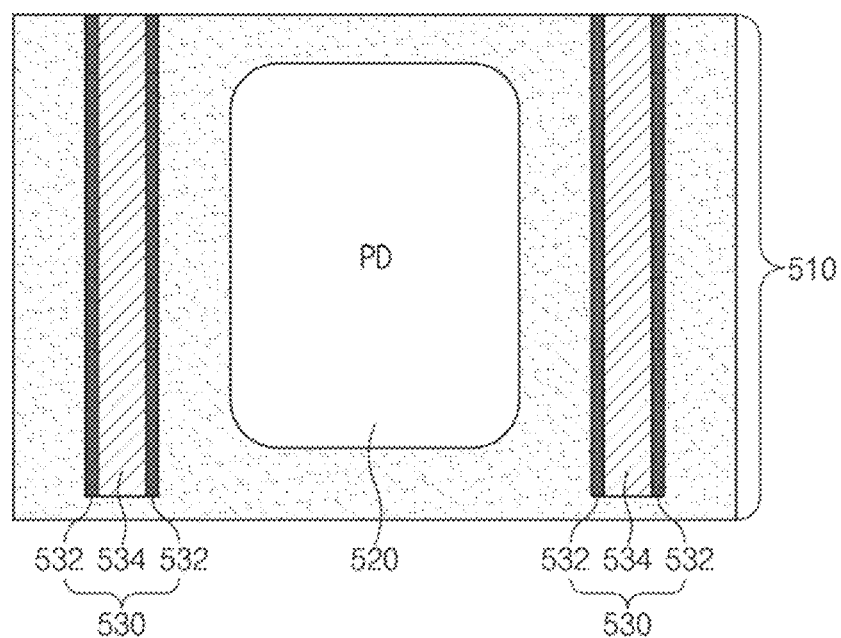
FIG. 12 is a diagram illustrating the active pixel at another fabrication step in one method based on some embodiments of the disclosed technology.

FIG. 12 is a diagram illustrating the active pixel at another fabrication step in one method based on some embodiments of the disclosed technology.

In a fourth process 1200, the deep trench 535 may be filled with a conductive material, resulting in formation of the electrode 534.

Figure 13:
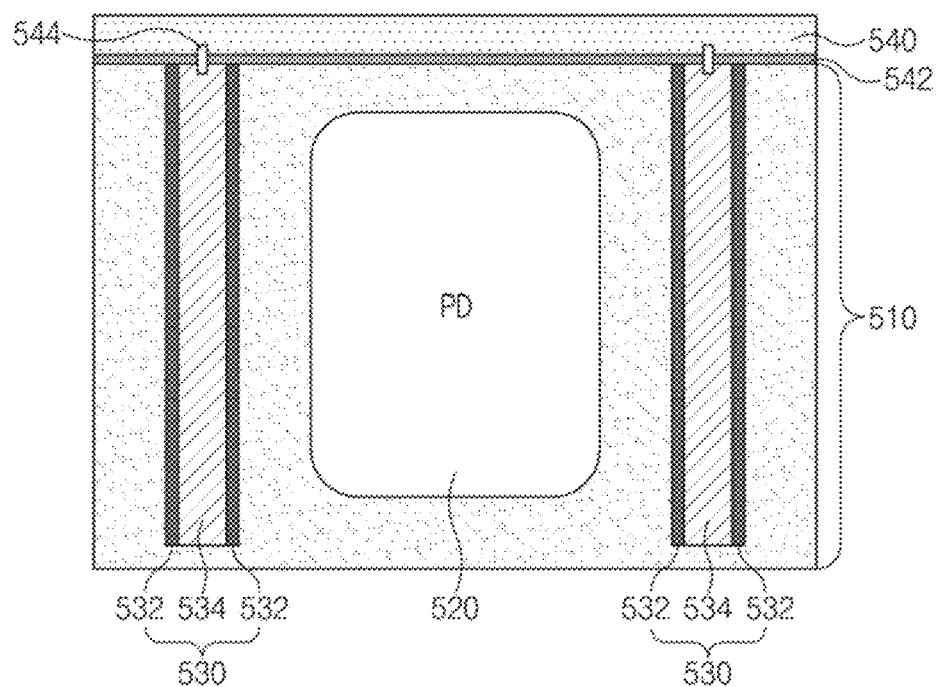
FIG. 13 is a diagram illustrating the active pixel at another fabrication step in one method based on some embodiments of the disclosed technology.

FIG. 13 is a diagram illustrating the active pixel at another fabrication step in one method based on some embodiments of the disclosed technology.

In a fifth process 1300, after a top surface of the substrate 510 is planarized as needed, the insulation layer 542, the contact 544, and the transparent electrode layer 540 may be sequentially formed through a deposition process.

Although FIGS. 9 to 13 have been disclosed based on the active pixel 500 only for convenience of description, the first to fifth processes can be commonly applied to the active pixel 500 and the optical black pixel 600, and it should be noted that constituent elements disposed over the transparent electrode layer 540 in the active pixel 500 may be different in structure from constituent elements disposed over the transparent electrode layer 540 in the optical black pixel 600.

The image sensor 100 implemented based on the embodiments of the disclosed technology may accumulate and fix holes not only at the DTI surface but also at the surface of the substrate, and may efficiently prevent a dark source (e.g., electrons) from occurring in the DTI surface and the substrate surface, resulting in reduction of noise in each pixel signal.

The image sensor implemented based on the embodiments of the disclosed technology may independently adjust a bias value to be applied to each active pixel and a bias value to be applied to each optical black pixel, such that a dark offset capable of reducing the quality of pixel signals can be minimized.

In some embodiments of the disclosed technology, the image sensor includes photodiodes and deep trench isolation (DTI) structures configured to optically isolate the photodiodes from one another, with a transparent electrode layer being formed over the photodiodes. The DTI structure is electrically connected to the transparent electrode layer to receive a negative bias to accumulate, along the DTI structure and the transparent electrode layer, electron holes that can resist electron flow that can result in dark noise.

It is understood that various embodiments and terminology used herein are not intended to limit technical ideas described in this document to specific embodiments, but rather to include various modifications, equivalents, and/or alternatives of the embodiments. Wherever possible, the same reference numbers will be used throughout the drawings to refer to the same or like portions. As used in the specification and appended claims, the terms "a", "an", "one", "the" and other similar terms include both singular and plural forms, unless context clearly dictates otherwise. A singular representation may include a plural representation unless otherwise stated in context. In the present application, an expression such as "A or B", "at least one of A and B", "at least one of A or B", "A, B or C", "at least one of A, B and C", or "at least one of A, B, or C" may include all possible combinations of one or more items selected from among listed related items. An expression such as "first" and "second" used in the present application may indicate corresponding constituent elements regardless of order and/or importance, is used to distinguish a constituent element from another constituent element, and does not limit corresponding constituent elements. When it is described that a constituent element (e.g., a first constituent element) is "(functionally or communicatively) coupled to" or is "connected to" another constituent element (e.g., a second constituent element), it should be understood that the constituent element may be directly (e.g., by wire) connected to the other constituent element, may be wirelessly connected to the other constituent element, or may be connected to the other constituent element through another constituent element (e.g., a third constituent element).

The term "module" as used in the present application includes a unit configured with hardware, software, or firmware and may be interchangeably used with a term such as a logic, logic block, component, or circuit. The term "module" may be an integrally configured component or a minimum unit or a portion thereof that performs at least one function. The term "module" may be implemented mechanically or electronically and may include, for example, an application-specific integrated circuit (ASIC).

Various embodiments of the present application may be implemented as software (e.g., program) including one or more instructions stored in a storage medium (e.g., on-board memory or external memory) readable by a machine (e.g., electronic device). For example, a processor (e.g., processor) of the machine (e.g., the electronic device) may retrieve at least one instruction from among the instructions stored in the storage medium, and may execute the retrieved instruction, such that the machine can operate to perform at least one function in response to the at least one retrieved instruction. The one or more instructions may include code generated by a compiler or code capable of being executed by an interpreter. The machine-readable storage medium may be implemented as a non-transitory storage medium. In this case, the term "non-transitory storage medium" may indicate that the storage medium is a tangible device and does not include signals (e.g., electromagnetic waves), and the term "non-transitory" does not discriminate between one case in which data is permanently stored in the storage medium and the other case in which data is temporarily stored in the storage medium.

In accordance with various embodiments, methods according to various embodiments disclosed in the present application may be contained in a computer program product, and may then be provided to users. The computer program products may be traded between sellers and buyers as goods. The computer program product may be implemented as a machine-readable storage medium (e.g., a compact disc read only memory CD-ROM) and then rapidly distributed to users. Alternatively, the computer program product may be directly distributed to two user devices (e.g., smartphones), may be distributed to two user devices (e.g., smartphones) through an application store (e.g., Play Store™), or may be distributed online to two user devices (e.g., smartphones) (e.g., downloaded or uploaded). In online distribution, at least a portion of the computer program product may be temporarily or provisionally stored in a machine-readable storage medium, for example, a server of a manufacturing company, a server of an application store, or a memory of a relay server.

In accordance with various embodiments, each (e.g., a module or program) of the above-mentioned constituent elements may include one or more entities. In accordance with various embodiments, at least one constituent element from among the above-mentioned constituent elements or at least one operation may be omitted, or one or more other constituent elements or one or more other operations may be added. Alternatively or additionally, the plurality of constituent elements (e.g., modules or programs) may be integrated into only one constituent element. In this case, the integrated constituent element may perform one or more functions of each of the plurality of constituent elements in the same way as or in a similar way to the previous operation that has been executed by the corresponding constituent element from among the plurality of constituent elements prior to execution of such integration. According to various embodiments, operations performed by a module, a program, or another constituent element may be sequentially, parallelly, repeatedly, or heuristically executed, at least one of the above operations may be executed in different order or omitted, or another operation may be added.

As is apparent from the above description, the image sensor according to the embodiments of the disclosed technology may accumulate and fix holes not only at a surface of a Deep Trench Isolation (DTI) structure but also at a surface of the substrate, and may efficiently prevent a dark source (e.g., electrons) from occurring in the DTI and substrate surfaces, resulting in reduction of noise contained in each pixel signal.

The image sensor according to the embodiments of the disclosed technology may independently coordinate a bias value to be applied to each active pixel and a bias value to be applied to each optical black pixel, such that a dark offset capable of reducing the quality of pixel signals can be minimized.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein without departing from the spirit and essential characteristics of the disclosed technology. The above embodiments are therefore to be construed in all aspects as illustrative and not restrictive. The scope of the disclosed technology should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the disclosed technology or included as a new claim by a subsequent amendment after the application is filed.

Although a number of illustrative embodiments consistent with the disclosed technology have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An image sensor comprising:
an active pixel including at least one photodiode disposed in a substrate and configured to have a deep trench isolation (DTI) structure and a first transparent electrode layer, the DTI structure and the first transparent electrode layer being coupled to each other and configured to receive a first bias for accumulating electrical charges along the DTI structure; and
an optical black pixel including at least one photodiode disposed in the substrate and configured to have the DTI structure and a second transparent electrode layer, the DTI structure and the second transparent electrode layer being coupled to each other and configured to receive a second bias for accumulating electrical charges along the DTI structure,
wherein the first bias is adjustable independently from the second bias,
wherein the active pixel further includes a color filter disposed over the substrate and configured to selectively allow a light signal having a specific wavelength to pass through,
wherein the first transparent electrode layer is disposed between the substrate and the color filter, and
wherein each of the first transparent electrode layer and the second transparent electrode layer causes electron holes to be accumulated and fixed in the substrate.

2. The image sensor according to claim 1, wherein:
the DTI structure of each of the active pixel and the optical black pixel is configured to isolate the photodiode from neighboring pixels,
the transparent electrode layer of each of the active pixel and the optical black pixel is located over the photodiode.

3. The image sensor according to claim 2, wherein the DTI structure of each of the active pixel and the optical black pixel includes:
a sidewall formed of an insulation material that is different in refractive index from the substrate; and
an electrode formed of a conductive material that fills an inner region of the sidewall.

4. The image sensor according to claim 2, further comprising:
an insulation layer disposed between the substrate and the transparent electrode layer.

5. The image sensor according to claim 4, wherein the DTI structure is electrically coupled to the transparent electrode layer through a contact passing through the insulation layer.

6. The image sensor according to claim 1, wherein the first bias and the second bias are pre-determined to minimize a difference in dark-level signal between the active pixel and the optical black pixel.

7. The image sensor according to claim 1, further comprising:
an one-time programmable (OTP) memory configured to store a voltage value of the first bias and a voltage value of the second bias.

8. The image sensor according to claim 1, wherein the optical black pixel includes:
a light shielding layer disposed and configured to block incident light from entering the at least one photodiode.

9. An image sensor comprising:
an active pixel configured to generate a pixel signal corresponding to incident light;
an optical black pixel configured to generate another pixel signal that is not due to the incident light;
a first bias generator configured to generate a first bias for accumulating electrical charges along a deep trench isolation (DTI) structure and a first transparent electrode layer arranged in the active pixel to apply the first bias to DTI structure and the first transparent electrode layer; and
a second bias generator configured to generate a second bias for accumulating electrical charges along a DTI structure and a second transparent electrode layer arranged in the optical black pixel to apply the second bias to the DTI structure and the second transparent electrode layer,
wherein the first bias is adjustable independently from the second bias,
wherein each of the active pixel and the optical black pixel includes a photodiode disposed in a substrate,
wherein the active pixel further includes a color filter disposed over the substrate and configured to selectively allow a light signal having a specific wavelength to pass through,
wherein the first transparent electrode layer is disposed between the substrate and the color filter, and wherein each of the first transparent electrode layer and the second transparent electrode layer causes electron holes to be accumulated and fixed in the substrate.

10. The image sensor as in claim 9, wherein the optical black pixel includes a light shielding layer over the photodiode within the optical black pixel and disposed and configured to block light incident to the optical black pixel from entering the photodiode within optical black pixel.

11. The image sensor as in claim 9, wherein:
the active pixel includes a lens above the photodiode to direct the incident light into the photodiode; and
the optical black pixel includes a light shielding layer over the photodiode within the optical black pixel and disposed and configured to block light incident to the optical black pixel from entering the photodiode within optical black pixel.

12. The image sensor as in claim 11, wherein the color filter of the active pixel is located between the lens and the photodiode of the active pixel.

13. The image sensor as in claim 1, wherein:
the active pixel includes a lens above the photodiode within the active pixel to direct the incident light into the photodiode; and
the optical black pixel includes a light shielding layer over the photodiode within the optical black pixel and disposed and configured to block light incident to the optical black pixel from entering the photodiode within optical black pixel.

14. The image sensor as in claim 13, wherein the color filter of the active pixel is located between the lens and the photodiode of the active pixel.

* * * * *